United States Patent [19]

Herndon

[11] Patent Number: 4,627,034
[45] Date of Patent: Dec. 2, 1986

[54] MEMORY CELL POWER SCAVENGING APPARATUS AND METHOD

[75] Inventor: William H. Herndon, Sunnyvale, Calif.

[73] Assignee: Fairchild Camera and Instrument Corporation, Mountain View, Calif.

[21] Appl. No.: 669,929

[22] Filed: Nov. 9, 1984

[51] Int. Cl.$^4$ .............................................. G11C 13/00
[52] U.S. Cl. ..................................... 365/226; 365/227
[58] Field of Search ................ 365/226, 227, 189, 230

[56] References Cited

U.S. PATENT DOCUMENTS 4,422,162 12/1983 Davis et al. .......................... 365/227

Primary Examiner—Terrell W. Fears
Attorney, Agent, or Firm—Ciotti & Murashige

[57] ABSTRACT

The present invention utilizes the power available for application to a static RAM cell in a manner which provides efficient use of the power so that greater standby power may be applied to the static RAM to increase the memory speed. The current required to maintain the memory cell in a preset state flows from the $U_{cc}$ source through a row of parallel memory cells and through a common bias supply and various peripheral circuits, such as decoders. A shunt voltage regulator controls the dependence of the common bias supply voltage on current fluctuations caused by addressing and deaddressing the memory cells. The invention includes an isolation device for isolating a particular row of memory cells when it is addressed without disturbing the bias on other memory cell rows. Similarly, the reference voltages of each of the peripheral circuits can be made independent of the common bias supply voltage and independent of the other peripheral circuits by the use of a local voltage regulator on each peripheral.

22 Claims, 5 Drawing Figures

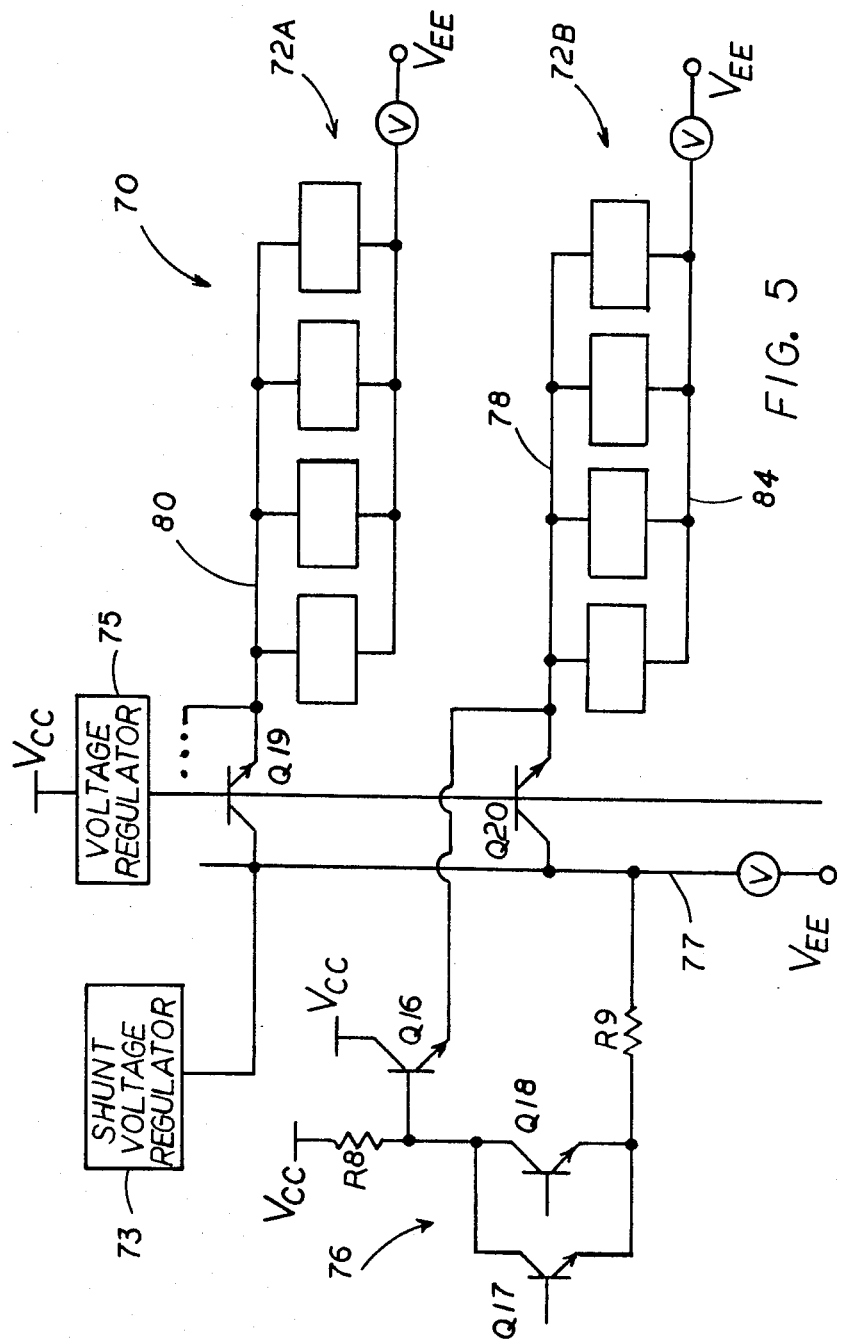

MEMORY CELL POWER SCAVENGING APPARATUS AND METHOD

BACKGROUND OF THE INVENTION

This invention relates generally to digital computer memory cells and particularly to apparatus and methods for supplying standby current to a static bipolar random access memory. Still more particularly, this invention relates to apparatus and methods for supplying standby current to a bipolar static random access memory cell to maintain a stored logic state.

A static semiconductor memory cell has the ability to store data indefinitely as long as sufficient power, known as the "standby power" is applied to the cell. In contrast, a dynamic memory requires that the stored data be periodically rewritten to prevent the data from becoming lost. Static memory cells are essentially flip flops that can maintain a given state indefinitely whereas dynamic memory cells use capacitances that must be periodically recharged.

In most prior static RAMs, the memory cell standby current flows from the most positive power supply to the most negative power supply and has no useful function other than providing the power required to maintain a stored logic state. An improved static RAM uses the standby current from a first group of memory cells to supply the power for a second group of memory cells.

The memory speed of a static RAM is a function of the standby power applied such that greater standby power results in a faster memory. Sophisticated digital computers require very fast memories. Accordingly, there is a need in the art for a bipolar static ECL RAM cell which better utilizes the available power to provide a memory speed superior to that of prior devices. Further, there is a need for greater efficiency in the use of standby power in integrated systems.

SUMMARY OF THE INVENTION

The present invention is an apparatus and method for more efficiently utilizing the standby power that is available in an integrated circuit in a system comprised of individual circuits. The result can be either increased circuit speed because more standby power is available for application to circuits in the system that were previously power starved, or power savings in that less power is needed for operating the circuit because of more efficient utilization of a given amount of power made available to the circuit. The invention may be used with any system having individual subsystems that operate over different ranges of voltage and that require standby power.

In a preferred embodiment of the invention used with diode coupled static RAM cells that are addressed by dropping the word line to a logic low, the current required to maintain the memory cell in a preset state flows from the $V_{cc}$ source through a first biasing resistor and through a row of parallel memory cells. After leaving the memory cells, the current passes through an isolation device, which may be a second resistor or a transistor, to a common bias supply bus. From the common bias supply bus the current is directed to various peripheral circuits, such as decoders. A shunt voltage regulator limits the dependence of the common bias supply bus voltage on the currents sourced by the memory cells and sunk by the peripheral circuits connected to the common bias supply bus.

The first resistors in series with the parallel group of memory cells and the isolation device provide means for changing the bias on a particular row of memory cells when it is addressed without disturbing the bias on other memory cell rows. Similarly, the reference voltages of each of the peripheral circuits can be made independent of the common bias supply bus voltage and independent of the other peripheral circuits by the use of a local voltage regulator on each peripheral.

In a second preferred embodiment of the invention used with ECL static RAM cells that are addressed by placing the word line in a logic high state, the invention includes a transistor connected to the common bias supply bus for supplying standby current to each of a plurality of parallel rows of memory cells. Peripheral circuits connected to the common bias supply bus supply current thereto through appropriate resistors. The decoder currents are used to supply the standby current to the memory cells when they are in the deaddressed state. When a row of memory cells is addressed, the row receives current from the $V_{cc}$ supply.

BRIEF DESCRIPTION OF THE DRAWINGS

FIG. 5 is a diagram of a second embodiment of the invention in which an emitter coupled logic memory comprising a plurality of rows of memory circuits substantially identical to the circuit of FIG. 4 receives standby current from a transistor connected to the common bias supply bus.

DESCRIPTION OF THE PREFERRED EMBODIMENT

Figure 1:
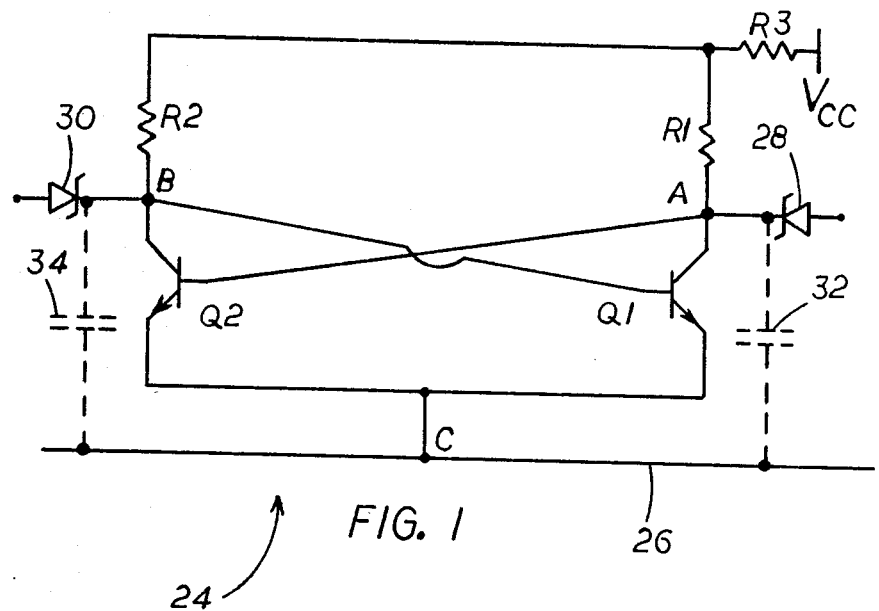
FIG. 1 is a schematic diagram of a diode coupled memory circuit.

Referring to FIG. 1, a typical diode coupled memory circuit 24 includes a pair of transistors Q1 and Q2. The collectors of the transistors Q1 and Q2 are connected through load resistors R1 and R2, respectively, to a power supply (not shown) having a voltage output $V_{cc}$ that is applied to a resistor R3. The junctions of the resistors R1 and R2 with the collectors of the transistors Q1 and Q2 are sometimes hereinafter referred to as nodes A and B, respectively. The collector of the transistor Q1 is connected to node A, which is connected to the base of the transistor Q2, and the collector of the transistor Q2 is connected to the node B which is connected to the base of the transistor Q1. The emitters of the transistors Q1 and Q2 are coupled together and are connected to a word address line 26 at a junction hereinafter referred to as node C.

The diode coupled memory circuit 24 usually has a Schottky diode 28 connected to node A and a Schottky diode 30 connected to node B. The Schottky diodes 28 and 30 allow a considerable increase in cell current during cell selection to enhance read and write performance as is well known by those skilled in the art.

The memory circuit 24 is addressed by dropping the word line 26 to a logic low state and deaddressed by raising it to a logic high state. One of the transistors Q1 or Q2 will be on while the memory circuit 24 is in the standby mode, and addressing the cell 24 by applying a logic low to the word line 26 causes a current to flow from $V_{cc}$ through the conducting transistor Q1 or Q2 to the word line 26. After the memory circuit 24 is addressed, the voltages at nodes A and B are indicative of a logic state that has been previously stored in the memory circuit 24. If Q2 is on, then the voltage at node A, $V_A$, is greater than the voltage at node B, $V_B$. Upon deaddress, node C goes high, which allows both the transistors Q1 and Q2 to be off. Even after Q1 turns off there is still a voltage difference $V_{AB}$ between the nodes A and B. The resistors R1 and R2 provide paths for the bias voltage $V_{cc}$ to charge the parasitic capacitances 32 and 34 between nodes A and B and node C, respectively, after the transistors Q1 and Q2 turn off. The voltages $V_A$ and $V_B$ rise together, maintaining the differential $V_{AB}$ that existed before the cell 24 was addressed. The voltages $V_A$ and $V_B$ rise until the transistor Q1 or Q2 that was on before the cell 24 was addressed turns on again so that after the memory cell 24 is deaddressed, it returns to its former logic state.

Figure 2:
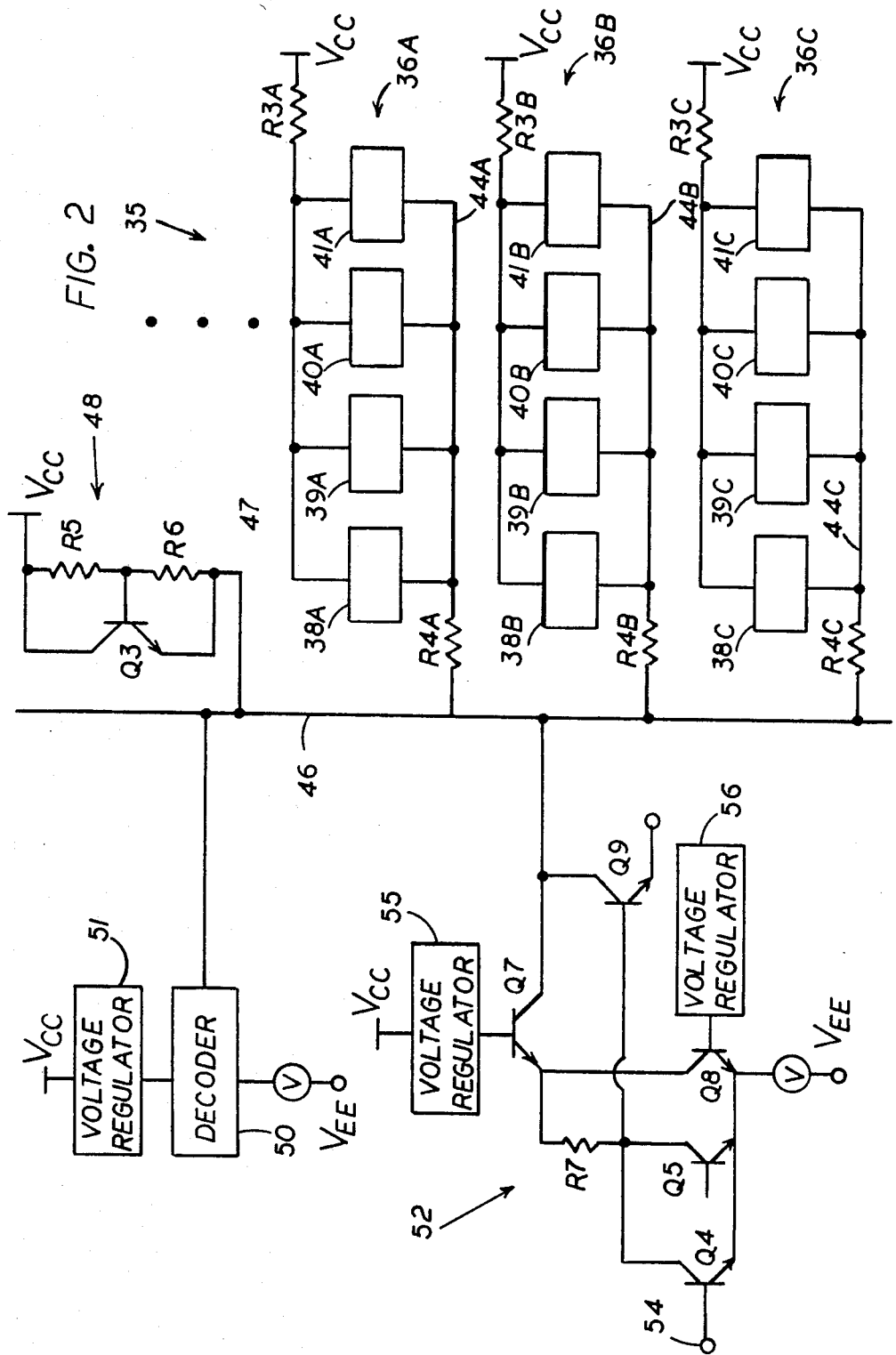
FIG. 2 is a schematic diagram of a preferred embodiment of the invention in which an emitter coupled logic memory comprising a plurality of rows of memory circuits substantially identical to the circuit of FIG. 1 and a peripheral circuit are connected to a common bias supply bus.

FIG. 2 illustrates a static RAM 35 that includes a plurality of diode coupled memory circuits that are substantially identical to the memory circuit 24. The memory circuits are arranged in a plurality of rows 36A, 36B, 36C, etc., with the row 36A containing, for example, four memory circuits, 38A, 39A, 40A and 41A. The rows 36B and 36C contain four memory circuits 38B, 39B, 40B, 41B, and 38C, 39C, 40C and 41C, respectively. Each row 36 may correspond to a word in the static RAM 35.

Each of the ECL circuits in the rows 36A, 36B, 36C, etc., is connected to a word line 44A, 44B, 44C, etc. The ECL circuits in each row 36A, 36B, 36C, etc., are connected in parallel and receive current from a power source $V_{cc}$ through resistors R3A, R3B, R3C, etc. The current output of each row 36A, 36B, 36C, etc., passes through a resistor R4A, R4B, R4C, etc., respectively to a common bias supply bus 46. The resistors R3A, R3B, etc. and the resistors R4A, R4B, etc. may be conveniently formed of polysilicon using well-known integrated circuit fabrication techniques; or they may be transistors properly biased to have the desired resistances.

The power supply $V_{cc}$ is connected to a voltage regulator 48, which may include a resistor R5 connected to $V_{cc}$ and between the base and collector of a transitor Q3. A resistor R6 is connected between the emitter and base of the transistor Q3. The output 47 of the voltage regulator 48 is taken between the emitter of Q3 and the resistor R6. The output 47 is maintained by the voltage regulator 48 at a constant voltage and is connected to the common bias supply bus bus 46. The voltage regulator 48 maintains an essentially constant voltage on the common bias supply bus 46 even if the amount current supplied thereto from the rows 36A, 36B, etc. varies as they are addressed and deaddressesd.

Figure 4:
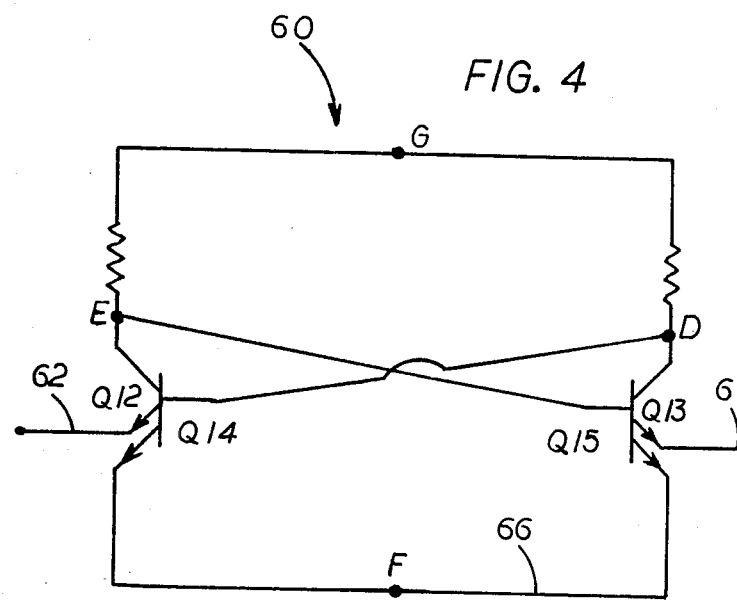
FIG. 4 is a schematic diagram of a second emitter coupled logic memory cell.

In addition to being connected to the memory cells, the common bias supply bus 46 is connected to one or more peripheral circuits. The peripheral circuits may, in general, include any circuit that requires a power supply more negative than $V_{cc}$; but for simplicity of illustration and explanation, FIG. 4 illustrates a pair of decoders 50 and 52 connected to the common bias supply bus 46.

The decoders 50 and 52 are essentially identical in structure; therefore only the decoder 52 is discussed in detail. The decoder 52 includes an input port 54 connected to the base of a transistor Q4. The collector and emitter of the transistor Q4 are connected to the collector and emitter of a transistor Q5. A resistor R7 is connected to the collectors of the transistors Q4 and Q5 and to the emitter of a transistor Q7. The emitter of the transistor Q7 and the resistor R7 are connected to the collector of a transistor Q8. The power supply $V_{cc}$ provides an input to a voltage regulator 55, which has an output connected to the base of the transistor Q7. A current sunk to a power supply $V_{ee}$ is connected to the emitters of the transistors Q4, Q5 and Q8. A voltage regulator 56 is connected to the base of the transistor Q8. The base of a transistor Q9 is connected to the collectors of the transistors Q4 and Q5, and the collectors of the transistors Q9 and Q7 are connected to the common bias supply bus 46. The output of the decoder 52 is taken from the emitter of the transistor Q9.

The memory cells each draw a standby current of, for example, 1 $\mu$A in the deaddressed state. In a 64K RAM the total standby current is therefore 64 milliamperes, which, as shown in FIG. 2, is input to the common bias supply bus 46 for supplying power to the decoders 50 and 52 before the current is sunk to the power supply $V_{ee}$, rather than being sunk directly to $V_{ee}$ as in the prior art.

In order to address a particular memory cell, it must be sufficiently isolated from the common bias supply bus 46. Therefore, the resistors R4A, R4B, R4C, etc. must have resistances sufficiently large that changes on the word lines 44A, 44B, 44C, etc., respectively, do not have a significant effect on the voltage of the common bias supply bus 46. The common bias supply bus 46 acts as a low impedance current source. Voltage changes on the common bias supply bus 46 are acceptable if the decoders 50 and 52 and other peripherals (not shown) connected to the common bias supply bus include voltage regulators, such as voltage regulator 55, to ensure the application of constant voltage to the decoders. Voltage regulators are essential if the various peripherals require different voltages.

Since each memory cell row has essentially the same structure, only the row 36C is hereinafter discussed in detail. The resistors R3C and R4C are used to select the bias on the row 36C. The value of R4C is not critical to power scavenging, but since R4C is a means for isolating the row 36C from the common bias supply bus 46 when the row is addressed, the ohmic value of R4C may be critical in the logic design of the static RAM 35. The time constant of R4C and the capacitance of the node 44C or the internal cell nodes to the substrate set the recovery time of the transition from the addressed state to the deaddressed state. The word line 44C should be brought up rapidly so that a new word line may be addressed without causing an ambiguity in the data output of the static RAM 35. The resistor R4C must be large enough to limit voltage swings on the common bias supply bus 46 and small enough to provide the desired recovery time.

Figure 3:
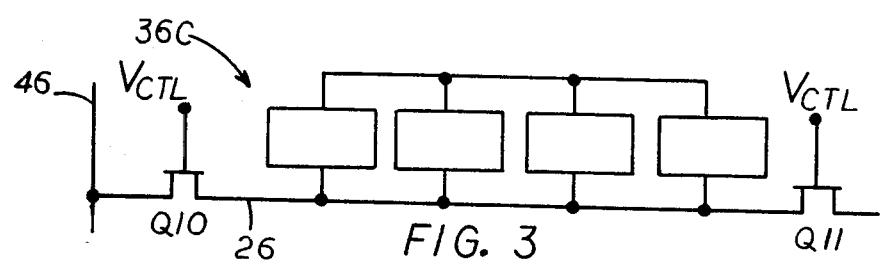
FIG. 3 is a schematic diagram of circuitry for isolating a memory cell of the arrangement of FIG. 1 from the common bias supply bus during read/write operations.

FIG. 3 illustrates an alternative means for isolating the word line 44C from the common bias supply bus 46. A transistor Q10, which may be formed of a suitable metal oxide semiconductor (MOS) or a bipolar device, is connected between the word line 26 and the common bias supply bus 46 so as to be able to allow current flow between the common bias supply bus 46 and the word line 44c or shut the word line off, depending on the state of a control signal $V_{CTL}$. The transistor Q10 is biased on by the $V_{CTL}$ signal when the row 36C is deaddressed so that the standby current from the row 36C may flow through the word line 44C to the common bias supply bus 46. When the row 36C is addressed, the transistor Q10 is turned off to isolate the word line 44C from the common bias supply bus 46, and a second MOS transistor Q11 is switched on to pull down the word line 44C. When the row 36C is deaddressed, the transistor Q11 is turned off; and the transistor Q10 is turned on by the $V_{CTL}$ signal. As will be apparent to those skilled in the art, the signal $V_{CTL}$ may be derived by known decoder circuitry coupled to the address inputs to turn the transistor Q10 off when the row to which the word line 66 is addressed.

FIG. 4 illustrates a diagram of an ECL circuit 60 that is addressed by taking the word line high and deaddressed by taking the word line low as is well known by those skilled in the art. The ECL circuit 60 includes a first multiemitter transistor Q12, Q14 and a second multiemitter transistor Q13, Q15. A pair of bit lines 62 and 64 are connected to the emitters Q12 and Q13, respectively, while both emitters Q14 and Q15 are coupled to a word line 66. The bit lines 62 and 64 are driven low when the ECL circuit 60 is addressed.

Referring to FIG. 5 an ECL static RAM 70 includes a plurality of rows 72A, 72B, etc., of ECL circuits that are substantially identical to the ECL circuit 60. The ECL circuits 60 are connected in parallel in each row 72A, 72B, etc. which may include any desired number of such circuits; and each row has a word line, such as the word line 80 for row 72A, the word line 78 for the row 72B, etc.

A voltage regulator 75, which is substantially identical to the voltage regulator 48, is connected to the bases of a pair of transistors Q19 and Q20. The emitters of the transistors Q19 and Q20 are coupled to the word lines 80 and 78, respectively; and the collectors of the transistors Q19 and Q20 are coupled to the common bias supply bus bus 77. The transistors Q19 and Q20 supply current to the word lines 80 and 78, respectively, during the deaddressed state. The voltage regulator 75 regulates the voltage on the bases of the transistors Q19 and Q20 to maintain an essentially constant standby voltage supply to the word lines 80 and 78 in the deaddressed state.

One or more peripheral circuits such as a decoder 76 are also connected to the common bias supply bus bus 77. The decoder 76 includes a resistor R8 connected between the power supply $V_{cc}$ and the base of a transistor Q16. The collector of the transistor Q16 is connected to the power supply $V_{cc}$. The emitter of the transistor Q16 is connected to the word line 78 of the row 72B to supply current to the word line 78 when the row 72B is addressed. The base of the transistor Q16 and the resistor R8 are connected to the collectors of a pair of transistors Q17 and Q18. The emitters of the transistors Q17 and Q18 are connected together to a resistor R9, which is connected to the common bias supply bus bus 77. The bases of the transistors Q17 and Q18 serve as the inputs for the decoder 76.

Current passing through the rows 72A and 72B is sunk to the power supply $V_{ee}$ through word lines 82 and 84, respectively. The common bias supply bus 77 is also connected to $V_{ee}$. A shunt voltage regulator 73 coupled to the common bias supply bus bus 77 maintains the voltage on the common bias supply bus bus 77 essentially constant regardless of fluctuations in standby current in the word lines 78 and 80.

It is to be understood that any desired number of memory cell rows and decoders may be connected to the common bias supply bus bus 77. The two rows 72A and 72B and the decoder 76 are shown in FIG. 5 only for purposes of illustrating and explaining the structure and method of operation of the invention. Each cell in an ECL static RAM of the type shown in FIG. 5 typically requires a standby current of about 2 $\mu$A for a 16 K RAM. A 1 K RAM requires about 30 $\mu$A per cell in the standby mode.

When the decoder 76 receives signals at the bases of the transistors Q17 and Q18 indicating that the row 72B is not being addressed, current from Q17 and Q18 passes through the resistor R9 to the common bias supply bus bus 77, which then applies this current to the word lines 80 and 78 through the transistors Q19 and Q20. The voltage regulator 75 must provide adequate bias to the bases of the transistors Q19 and Q20 so that the transistors Q19 and Q20 are able to supply sufficient standby current to the word lines 80 and 78, respectively.

When the row 72B is addressed (Q17 and Q18 in the decoder 76 off), the transistor Q16 turns on and current flows out of the emitter of the transistor Q16 to the word line 78 to address the row 72B. When the row 74 is addressed, the transistor Q20 turns off to isolate the row 74 from the common bias supply bus bus 77.

Special care should be exercised in initially providing bias to the static RAM 70 so that the common bias supply bus 77 can sink sufficient current to provide power to the deaddressed decoders, such as the decoder 76.

Although the invention has been described with reference to specific preferred embodiments, it is understood that those skilled in the art may make modifications to the preferred embodiments without departing from the scope of the invention as defined in the appended claims.

What is claimed is:

1. A system for efficiently using standby current in a system, comprising:

a single power supply having first and second voltage level outputs;

a memory circuit coupled to one of said voltage level outputs to receive standby power in a deaddressed state;

a common bias supply bus connected to receive standby current from said memory circuit, said common bias supply bus having a voltage level between said first and second voltage level outputs; and at least one second circuit connected to said common bias supply bus such that at least some of the standby current of said memory circuit may flow through said second circuit to provide a portion of the current required to operate said second circuit.

2. The system of claim 1 further comprising:

means for selectively addressing said memory circuit to read digital data stored therein; and means for isolating said memory from said common bias supply bus while said memory circuit is addressed.

3. The system of claim 2 wherein said isolating means comprises a resistor connected between said memory circuit and said common bias supply bus.

4. The system of claim 3 further comprising means for biasing said memory circuit to establish a predetermined standby current.

5. The system of claim 4 wherein said biasing means comprises a biasing resistor connected between said memory circuit and said power supply.

6. The system of claim 2 wherein said isolating means comprises a switching device connected between said memory circuit and said common bias supply bus, said switching device being in a conductive state while the standby current flows through said memory circuit, said switching device being in a non-conductive state while said memory cell is addressed to limit the flow of electrical current between the memory circuit and the common bias supply bus.

7. The system of claim 6 wherein said switching device comprises a transistor.

8. The system of claim 6 further comprising a voltage regulator coupled to said common bias supply bus to limit voltage fluctuations thereon as the memory circuit goes between the addressed and deaddressed states.

9. The system of claim 1 wherein the memory circuit comprises an emitter coupled logic circuit.

10. The system of claim 1 further comprising:
a plurality of rows of memory circuits connected to supply standby current from said said common bias supply bus, each said row including a plurality of memory circuits;
means for selectively addressing the rows of memory circuits; and
means for substantially isolating each row of addressed memory circuits from said common bias supply bus such that standby current fluctuations from said rows caused by changes between the addressed and the deaddressed states do not substantially affect the voltage level of said common bias supply bus.

11. The system of claim 10 wherein each of said memory circuits comprises an emitter coupled memory cell.

12. The system of claim 10 wherein each of said memory circuits comprises a diode coupled memory cell.

13. The system of claim 10 further comprising a voltage regulator coupled to said common bias supply bus to limit voltage fluctuations thereon as said rows of memory circuits are addressed and deaddressed.

14. The system of claim 10 wherein said means for isolating comprises a resistor coupled to each said row and selected to have a resistance that is sufficiently high to prevent substantial sinking of current from said common bias supply bus when the row associated with a particular resistor is addressed and a resistance that is sufficiently low so as not to substantially impede the flow of standby current between said row and said common bias supply bus when said row is deaddressed.

15. The system of claim 10 wherein said means for isolating comprises a transistor associated with each row, said transistor having a switching path and switching node for receiving a signal which controls current flow through said switching path, said transistor having its switching path coupled between its associated row and said common bias supply bus and having its switching node coupled to a signal from said means for selectively addressing such that said switching path is conductive when said row is deaddressed and non-conductive when said row is deaddressed.

16. An apparatus for more efficiently utilizing the standby current in a system, comprising:
a single power supply for providing a single voltage level output relative to a reference voltage level;
a first subsystem coupled to draw operating current from said power supply and operating over a first voltage range within the range of voltage between said single voltage level output and said reference voltage level;
a common bias supply bus coupled to said first subsystem to receive said operating current; and
a second subsystem operating over a second voltage range within the range defined by said single voltage level output and said reference voltage level, said second subsystem being coupled to said common bias supply bus to draw operating current therefrom.

17. An apparatus as defined in claim 16 wherein said first and second voltage ranges do not overlap.

18. An apparatus as defined in claim 16, further comprising voltage regulator means coupled to said common bias supply bus to maintain the voltage thereon relatively constant despite fluctuations in the operating current drawn by said first and second subsystems.

19. A method for supplying standby current from a power source to a static random access memory, comprising the steps of:
passing standby current through a deaddressed memory circuit to a common bias supply bus; and
passing at least part of said standby current from said memory circuit through a circuit coupled to said common bias supply bus.

20. The method of claim 19, further comprising the steps of:
addressing the memory circuit; and
isolating the memory circuit from the common bias supply bus while the memory circuit is addressed.

21. The method of claim 20 wherein the isolating step comprises the step of connecting a resistor between the memory circuit and the common bias supply bus.

22. The method of claim 18 wherein the isolating step comprises the steps of:
connecting a switching device between the memory circuit and the common bias supply bus; and
changing the switching device from a conductive to a non-conductive state as the memory circuit is addressed.

* * * * *